United States Patent [19]

Kimura

[11] Patent Number: 5,266,892
[45] Date of Patent: Nov. 30, 1993

[54] METHOD OF MEASURING INTERFACE STATE DENSITY DISTRIBUTION IN MIS STRUCTURE

[75] Inventor: Mikihiro Kimura, Itami, Japan

[73] Assignee: Mitsubishi Denki Kabushiki Kaisha, Tokyo, Japan

[21] Appl. No.: 798,177

[22] Filed: Nov. 26, 1991

[30] Foreign Application Priority Data

Apr. 15, 1991 [JP] Japan .................................. 3-82121

[51] Int. Cl.$^5$ ............................................ G01R 31/26
[52] U.S. Cl. .............................. 324/158 D; 324/73.1
[58] Field of Search ............. 324/73.1, 158 R, 158 D, 324/500, 537, 600; 307/450, 303.1, 303; 357/23.2; 437/8; 257/48; 371/15.1, 16.1

[56] References Cited

U.S. PATENT DOCUMENTS 3,975,648  8/1976  Tobey, Jr. et al. ............... 357/23.12
4,827,212  5/1989  Kamieniecki .................... 324/158 R

FOREIGN PATENT DOCUMENTS 0040691 12/1981 European Pat. Off. .

OTHER PUBLICATIONS

S. M. Sze, Physics of Semiconductor Devices, 1982, pp. 378–391.
IEEE Transactions on Electron Devices, vol. ED-13, No. 10, pp. 701–705, C. N. Berglund, "Surface States at Steam-Grown Silicon-Silicon Dioxide Interfaces", Oct. 1966.
Solid State Electronics, vol. 13, pp. 873–885, 1970, "A Quasi-Static Technique for MOS C-V and Surface State Measurements", M. Kuhn.

Primary Examiner—Vinh Nguyen
Attorney, Agent, or Firm—Oblon, Spivak, McClelland, Maier & Neustadt

[57] ABSTRACT

A flat band voltage of a MIS structure is determined by measuring high-frequency C-V characteristics thereof, and a surface potential is calculated by the definite integral processing as a function of the flat band voltage. Ideal C-V characteristics of the MIS structure are determined from the surface potential. By comparing measured low-frequency or quasi-static C-V characteristics with the ideal C-V characteristics, the distribution of an interface state density is determined. Thus, the flat band voltage of an ideal C-V curve coincides with the flat band voltage of a low-frequency or quasi-static C-V curve, so that the interface state density distribution in the MIS structure can be accurately measured.

3 Claims, 5 Drawing Sheets

METHOD OF MEASURING INTERFACE STATE DENSITY DISTRIBUTION IN MIS STRUCTURE

BACKGROUND OF THE INVENTION

1. Field of the Invention

The present invention relates to a method of accurately measuring the distribution of an interface state density generated in a semiconductor device having a metal-insulator-semiconductor (MIS) structure.

2. Description of the Background Art

Characteristics of a semiconductor device having a MIS structure are largely changed by the presence of an interface state in the device. For determination of the characteristics of the semiconductor device, it is necessary to measure the distribution of an interface state density in the MIS structure of the semiconductor device. Some methods of measuring the interface state have been proposed, e.g., in Document 1 (C. N. Berglund, IEEE Trans. Electron Devices, ED-13, 701–705 (1966)) and in Document 2 (M. Kuhn, Solid-State Electronics, 13, 873–885 (1970)). In these methods, quasi-static C-V characteristics are initially measured. The solid curve of FIG. 4 shows an example of a quasi-static C-V curve indicative of the quasi-static C-V characteristics.

A surface potential is calculated from the quasi-static C-V characteristics (indicated by the solid curve of FIG. 4). C-V characteristics of an ideal MIS structure (hereinafter referred to as "ideal C-V characteristics") in which the interface state is absent, are determined on the basis of the conventionally known arithmetic expression. The dotted curve of FIG. 4 is an ideal C-V curve indicative of the ideal C-V characteristics. Comparison is made between the quasi-static C-V curve (or the solid curve of FIG. 4) and the ideal C-V curve (or the dotted curve of FIG. 4) to determine the interface state density distribution in the MIS structure.

As disclosed in Document 2, the surface potential $\phi_S(V_G)$ of the MIS structure when a gate voltage $V_G$ is applied to the metal serving as a gate electrode is derived from the following expression:

$$\phi_S(V_G) = \int_{V_{ACC}}^{V_G} \left[ 1 - \frac{C_{QS}(V_G)}{C_0} \right] dV_G + \Delta \quad (1)$$

where $V_{ACC}$ is the gate voltage when majority carriers are accumulated in the semiconductor; $C_{QS}(V_G)$ is the measured capacitance of the MIS structure when the gate voltage $V_G$ is applied; $C_O$ is the capacitance of a gate insulative film or an insulator capacitance; and $\Delta$ is the additive constant. As is known from (1), the expression for deriving the surface potential $\phi_S(V_G)$ includes the additive constant $\Delta$. The flat band voltage $V_{FB}'$ of the ideal C-V curve (or the dotted curve of FIG. 4) sometimes is the value of $\Delta'$ from the flat band voltage $V_{FB}$ of the quasi-static C-V curve (or the solid curve of FIG. 4). As a result, there has been a problem that the interface state density distribution in the MIS structure cannot be determined accurately.

The interface state density distribution determined in this manner has another problem. FIG. 5 shows an example of the interface state density distribution determined by the above-mentioned method. $E_V$ represents energy level at the upper edge of a valence band, and $E_C$ represents energy level at the lower edge of a conduction band.

An interface trap in the MIS structure becomes an acceptor type in an energy region above a mid-gap $E_{MG}$ in FIG. 5, and becomes a donor type in an energy region below the mid-gap $E_{MG}$. Thus, the polarity of the interface trap is inverted within a band gap of the semiconductor. As shown in FIG. 5, the interface state density is negative in a region below an energy $E_{FB}$ ($= q \cdot V_{FB}$). In this region, the logarithm of the interface state density cannot be calculated. Accordingly, changes in the logarithm of the interface state density in relation to the energy level between the energy levels $E_V$ and $E_C$ cannot be found.

SUMMARY OF THE INVENTION

The present invention is intended for a method of measuring an interface state density distribution in a metal-insulator-semiconductor (MIS) structure. According to the present invention, the method comprises the steps of: measuring high-frequency C-V characteristics of the MIS structure to determine a flat band voltage $V_{FB}$; measuring low-frequency or quasi-static C-V characteristics of the MIS structure to determine a surface potential $\phi_S$ by the following equation:

$$\phi_S = \int_{V_{FB}}^{V_G} \left( 1 - \frac{C}{C_0} \right) dV_G \quad (2)$$

where $V_G$ is a voltage applied to the metal, C is a measured capacitance of the MIS structure, and $C_0$ is an insulator capacitance of the MIS structure; calculating ideal C-V characteristics of the MIS structure as a function of the surface potential $\phi_S$; and comparing the low-frequency or quasi-static C-V characteristics with the ideal C-V characteristics to determine the distribution of an interface state density of the MIS structure.

Preferably, the interface state density $D_{it}(\phi_S)$ of the MIS structure is determined by the following equation:

$$D_{it}(\phi_S) = \frac{1}{q} \left\{ \left[ \frac{C}{1 - C/C_0} \right] - C_{SC}(\phi_S) \right\} \quad (3)$$

where q is a charge of an electron, and $C_{SC}(\phi_S)$ is an ideal depletion layer capacitance of the semiconductor.

Preferably, the method further comprises the step of determining the absolute value of the interface state density $D_{it}(\phi_S)$.

In another aspect of the present invention, a method of measuring an interface state density distribution in a metal-insulator-semiconductor (MIS) structure, comprises determining an interface state density of the MIS structure by comparing low-frequency or quasi-static C-V characteristics with ideal C-V characteristics, determining the absolute value of the interface state density, and representing the distribution of the interface state density of the MIS structure by the absolute value.

According to the present invention, the flat band voltage is determined by measuring the high-frequency C-V characteristics of the MIS structure, and the surface potential is calculated by the definite integral processing as a function of the flat band voltage. The ideal C-V characteristics of the MIS structure are found from the surface potential. Therefore, the flat band voltage of the ideal C-V curve coincides with the flat band voltage of the low-frequency or quasi-static C-V curve experimentally determined, so that the interface state density distribution in the MIS structure can be accurately measured.

The interface state density of the MIS structure is determined by comparing the low-frequency or quasi-static C-V characteristics with the ideal C-V characteristics, thereafter the absolute value of the interface state density being determined. Therefore, the interface state density is constantly positive, so that the logarithm thereof is calculable. Changes in the logarithm of the interface state density can be found over a wide range.

An object of the present invention is to provide a method of accurately measuring an interface state density distribution in a MIS structure.

Another object of the present invention is to provide a method of measuring an interface state density distribution in a MIS structure, capable of finding changes in the logarithm of an interface state density over a wide range.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
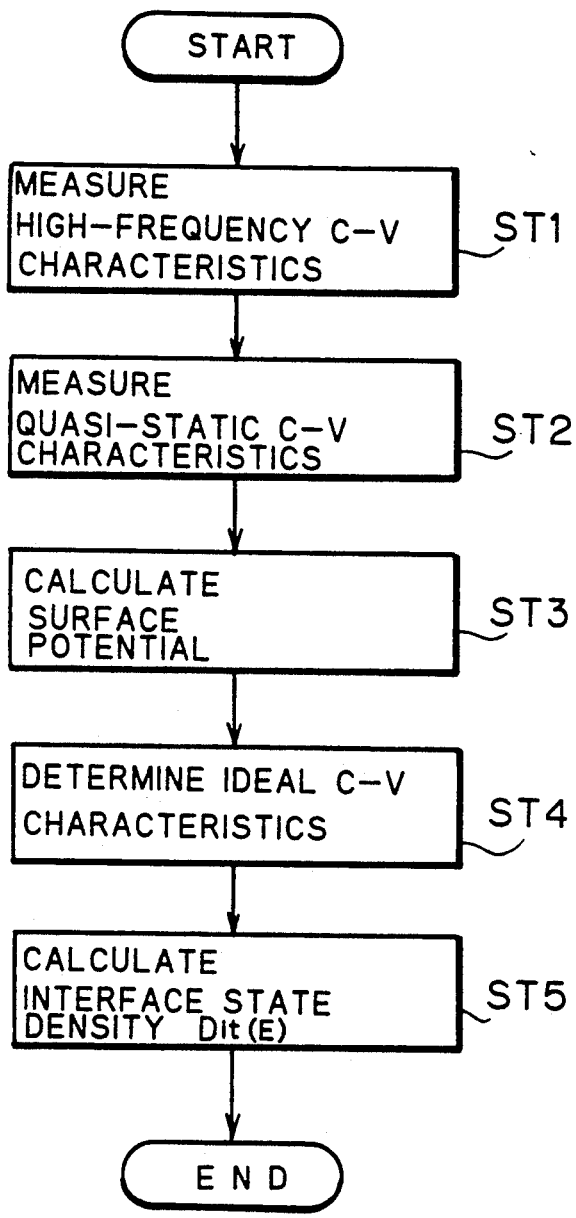
FIG. 1 is a flow chart of a method of measuring an interface state density distribution according to a preferred embodiment of the present invention.

FIG. 1 is a flow chart of a method of measuring an interface state density distribution according to a preferred embodiment of the present invention. In this preferred embodiment, high-frequency C-V characteristics of a MIS (metal—gate insulative film—p-type semiconductor) structure are initially measured (in the process step ST1) by using a high-frequency C-V method disclosed, for example, in Document 3 (S. M. Sze, Physics of Semiconductor Devices, 2nd Edition, John Wiley & Sons, pp. 362-430 (1982)). An accurate flat band voltage $V_{FB}$ is obtained in this process.

Figure 2:
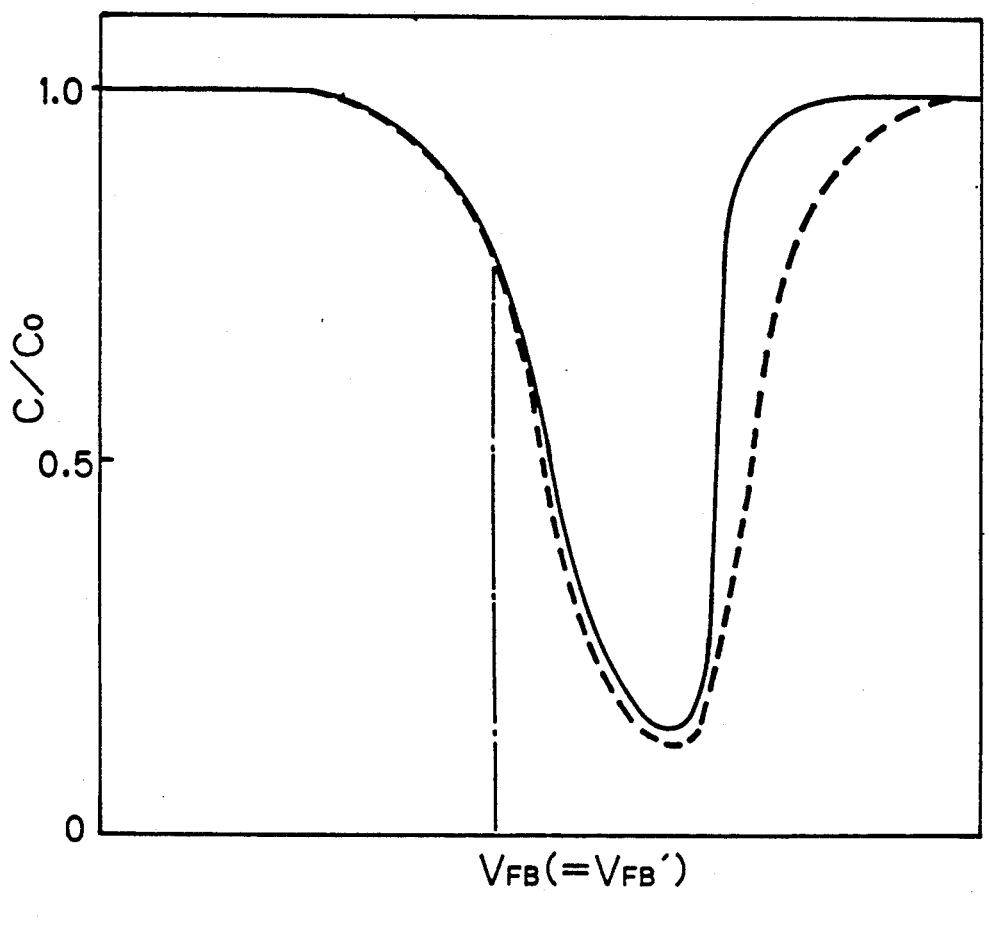
FIGS. 2 and 4 show C-V characteristics of a MIS structure, respectively.

In the process step ST2, quasi-static C-V characteristics are measured similarly to the prior art. The solid curve of FIG. 2 shows an example of a quasi-static C-V curve indicative of the quasi-static C-V characteristics. In FIG. 2, the abscissa represents a gate voltage $V_G$ applied to the MIS structure, and the ordinate represents the ratio ($C/C_O$) of a capacitance C of the MIS structure to a capacitance $C_O$ of the gate insulative film (or an insulator capacitance).

In the process step ST3, a surface potential $\phi_S(V_G)$ is calculated by the following formula:

$$\phi_S(V_G) = \int_{V_{FB}}^{V_G} \left[ 1 - \frac{C_{QS}(V_G)}{C_0} \right] dV_G \tag{4}$$

In the process step ST4, ideal C-V characteristics (indicated by the dotted curve of FIG. 2) are determined from the surface potential $\phi_S(V_G)$ thus obtained. That is, the surface potential $\phi_S(V_G)$ is substituted in the following formulas to determine an ideal depletion layer capacitance $C_{SC}$ of the p-type semiconductor in which the interface state is not taken into consideration.

$$C_{SC} = \frac{\epsilon_S}{\sqrt{2} \, L_D} \frac{\{1 - \exp(-\beta\phi_S) + (n_{p0}/p_{p0})[\exp(-\beta\phi_S) - 1]\}}{G(\beta\phi_S, n_{p0}/p_{p0})} \tag{5}$$

$$G(\beta\phi_S, n_{p0}/p_{p0}) = \{\exp(-\beta\phi_S) + \beta\phi_S - 1 + (n_{p0}/p_{p0})\exp(\beta\phi_S) - \beta\phi_S - 1)\}^{\frac{1}{2}} \tag{6}$$

$$L_D = \sqrt{\frac{\epsilon_S}{q p_{p0} \beta}} \tag{7}$$

$$\beta = k_B T/q \tag{8}$$

where $\epsilon_S$ is the dielectric constant of the p-type semiconductor; $n_{p0}$ is an electron density under a thermal equilibrium condition; $p_{p0}$ is a hole density under the thermal equilibrium condition; $L_D$ is the Debye length of a hole; $k_B$ is the Boltzmann's constant; T is an absolute temperature; and q is a charge electron. The capacitances $C_{SC}$ and $C_O$ are substituted in the following formula:

$$G)/[C_O + C_{SC}(V_G)] \tag{9}$$

to determine a capacitance $C_{id}$ when the gate voltage $V_G$ is applied to an ideal MIS structure. The ideal C-V characteristics are thus determined, which are shown by the dotted ideal C-V curve of FIG. 2.

Comparison is made between the quasi-static C-V curve (or the solid curve of FIG. 2) and the ideal C-V curve (or the dotted curve of FIG. 2) to determine the distribution of an interface state density in the MIS structure in the process step ST5. That is, the capacitances $C_{SC}(V_G)$ and $C_{QS}(V_G)$ are substituted in the following formulas to calculate the interface state density $D_{it}(E)$.

$$D_{it}(E) = \frac{1}{q} \left\{ \left[ \frac{C_{QS}(V_G)}{1 - C_{QS}(V_G)/C_0} \right] - C_{SC}(E) \right\} \tag{10}$$

$$E = E_G/2 - q\phi_f + q\phi_S \tag{11}$$

where $E_G$ is the band gap of the semiconductor, and $\phi_f$ is the Fermi potential.

According to the preferred embodiment, the accurate flat band voltage $V_{FB}$ is determined by the high-frequency C-V method, and the surface potential $\phi_S(V_G)$ is calculated by the definite integral operation based on the voltage $V_{FB}$ (in the process step ST3). Therefore, the surface potential $\phi_S(V_G)$ is found accurately without the influence of the additive constant $\Delta$. The flat band voltage $V_{FB}'$ of the ideal C-V curve coincides with the flat band voltage $V_{FB}$ of the quasi-static C-V curve, as shown in FIG. 2. As a result, the interface state density $D_{it}(E)$ can be determined with high accuracy.

Figure 3:
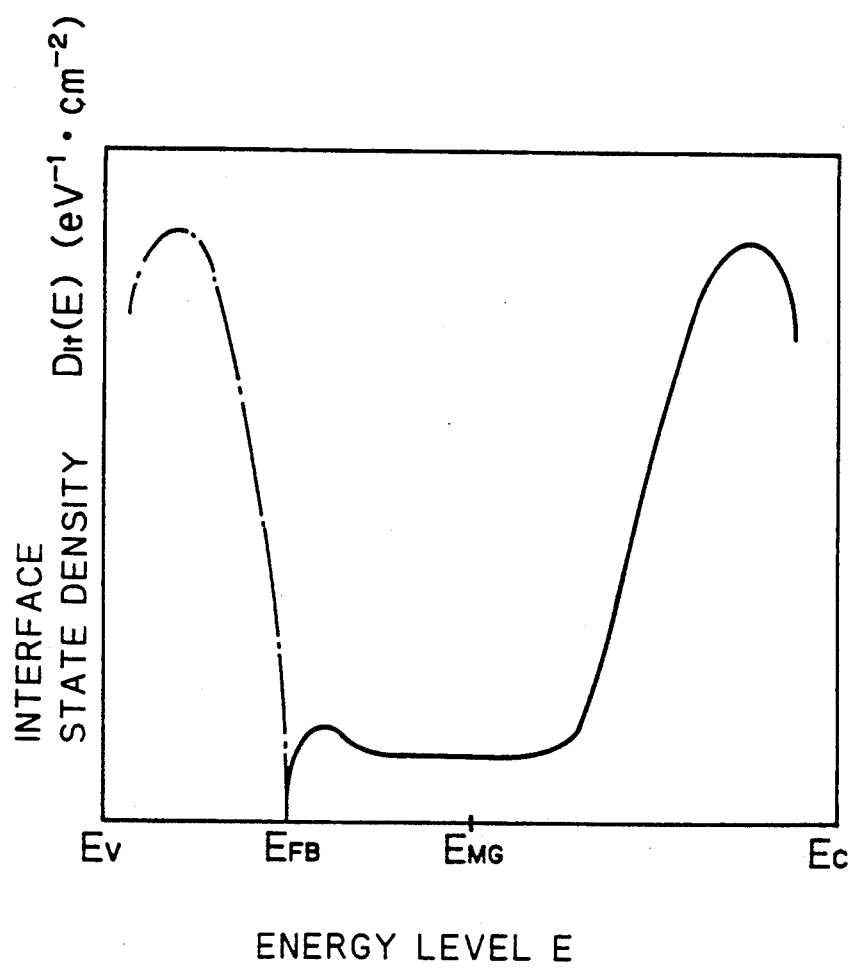
FIGS. 3 and 5 show the distributions of an interface state density, respectively.
Figure 4:
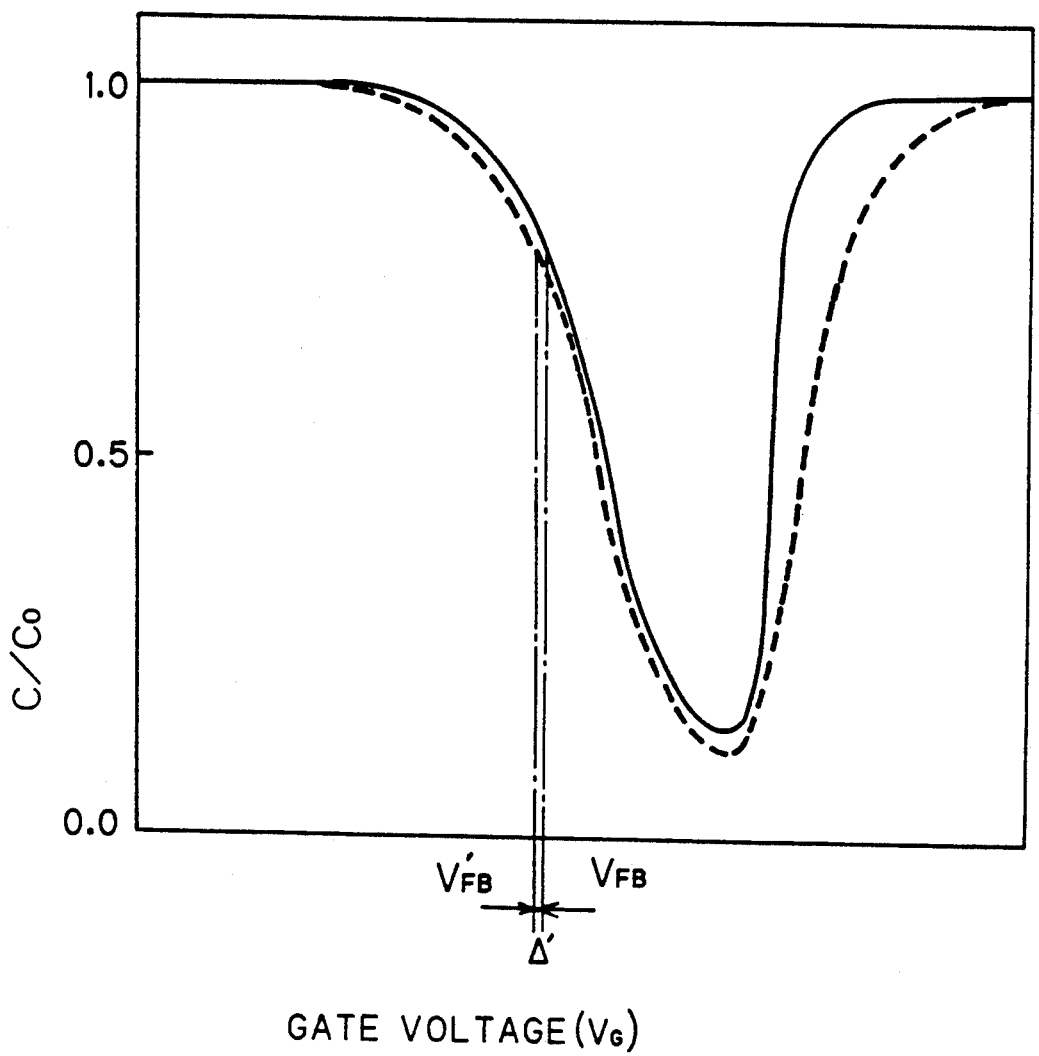
Figure 5:
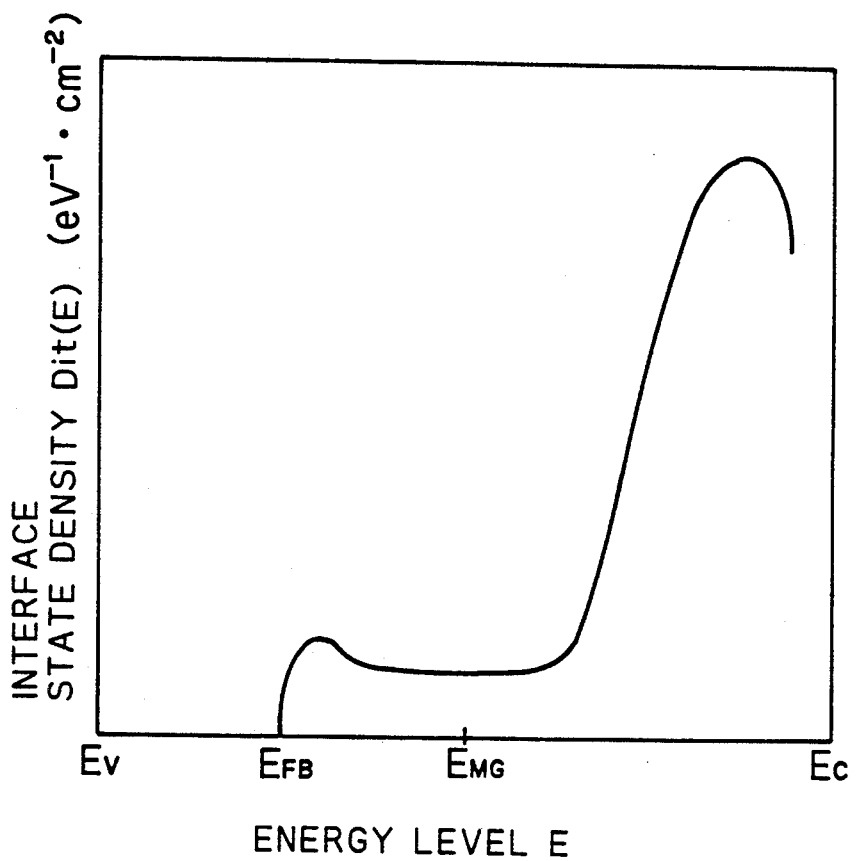

FIG. 3 shows an example of the interface state density distribution determined by the method of the preferred embodiment. $E_V$ represents energy level at the upper edge of a valence band, and $E_C$ represents energy level at the lower edge of a conduction band.

When the interface state density $D_{it}(E)$ is found based on the formula (10), the interface state density $D_{it}(E)$ is negative in a region below an energy level $E_{FB}$ ($=q \cdot V_{FB}$) for the aforesaid reason. As a result, changes in the logarithm of the interface state density $D_{it}(E)$ in relation to the energy level between the energy levels $E_V$ and $E_C$ cannot be found.

To solve this problem, the interface state density $D_{it}(E)$ should be calculated by the following formula in place of the formula (10).

$$D_{it}(E) = \left| \frac{1}{q} \left\{ \left[ \frac{C_{QS}(V_G)}{1 - C_{QS}(V_G)/C_0} \right] - C_{SC}(E) \right\} \right| \quad (12)$$

The dashed-and-dotted curve of FIG. 3 indicates the distribution of the interface state density $D_{it}(E)$ calculated by the formula (12). As is apparent from FIG. 3, the interface state density $D_{it}(E)$ is positive in the region between the energy levels $E_V$ and $E_C$. This affords the calculation of the logarithm of the interface state density $D_{it}(E)$ in the region between the energy levels $E_V$ and $E_C$.

The quasi-static C-V characteristics may be replaced with low-frequency C-V characteristics to determine the interface state density $D_{it}(E)$ in the same manner. In this case, similar effects can be provided.

While the invention has been shown and described in detail, the foregoing description is in all aspects illustrative and not restrictive. It is therefore understood that numerous modifications and variations can be devised without departing from the scope of the invention.

What is claimed is:

1. A method of measuring an interface state density distribution in a metal-insulator-semiconductor (MIS) structure, comprising the steps of:
    applying a voltage to said MIS structure;
    measuring high-frequency C-V characteristics of said MIS structure based upon said applied voltage to determine a flat band voltage $V_{FB}$;
    measuring low-frequency or quasi-static C-V characteristics of said MIS structure to determine a surface potential $\phi_s$ by the following equation:

$$\phi_s = \int_{V_{FB}}^{V_G} \left( 1 - \frac{C}{C_o} \right) dV_G$$

where $V_G$ is the voltage applied to the metal, C is a measured capacitance of said MIS structure, and $C_o$ is an insulator capacitance of said MIS structure;
    calculating ideal C-V characteristics of said MIS structure as a function of said surface potential $\phi_S$; and
    comparing said low-frequency or quasi-static C-V characteristics with said ideal C-V characteristics to determine the distribution of an interface state density of said MIS structure.

2. A method in accordance with claim 1, wherein said comparing step includes the step of obtaining the interface state density $D_{it}(\phi_S)$ of said MIS structure is determined by the following equation:

$$D_{it}(\phi_S) = \frac{1}{q} \left\{ \left[ \frac{C}{1 - C/C_0} \right] - C_{SC}(\phi_S) \right\}$$

where q is a charge of electron, and $C_{SC}(\phi_S)$ is an ideal depletion layer capacitance of the semiconductor.

3. A method in accordance with claim 2, further comprising the step of determining the absolute value of the interface state density $D_{it}(\phi_S)$.

* * * * *